US009953705B2

(12) United States Patent
Bedau

(10) Patent No.: US 9,953,705 B2
(45) Date of Patent: Apr. 24, 2018

(54) PLANAR MEMORY CELL ARCHITECTURES IN RESISTIVE MEMORY DEVICES

(71) Applicant: HGST Netherlands B.V., Amsterdam (NL)

(72) Inventor: Daniel Bedau, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/138,477

(22) Filed: Apr. 26, 2016

(65) Prior Publication Data

US 2017/0309332 A1 Oct. 26, 2017

(51) Int. Cl.
| | |
|---|---|
| G11C 11/00 | (2006.01) |
| G11C 13/00 | (2006.01) |
| H01L 45/00 | (2006.01) |
| H01L 23/528 | (2006.01) |
| H01L 27/24 | (2006.01) |

(52) U.S. Cl.
CPC ........ G11C 13/0007 (2013.01); G11C 13/004 (2013.01); G11C 13/0069 (2013.01); H01L 23/528 (2013.01); H01L 27/2481 (2013.01); H01L 45/1206 (2013.01); H01L 45/1226 (2013.01); H01L 45/1253 (2013.01); H01L 45/146 (2013.01); H01L 45/165 (2013.01); H01L 45/1608 (2013.01); H01L 45/1658 (2013.01); G11C 2013/009 (2013.01); G11C 2013/0045 (2013.01); G11C 2213/32 (2013.01);

(Continued)

(58) Field of Classification Search
CPC ............ G11C 13/0069; G11C 13/0004; G11C 13/0007
USPC .................................................. 365/148, 158
See application file for complete search history.

(56) References Cited

U.S. PATENT DOCUMENTS

| | | |
|---|---|---|
| 4,435,785 A | 3/1984 | Chapman |
| 4,853,561 A | 8/1989 | Gavrok |

(Continued)

OTHER PUBLICATIONS

Ungureanu et al., Three-terminal resistive switching memory in a transparent vertical-configuration device, Applied Physics Letter, 2014, 6 pages, vol. 104, No. 013503, AIP Publishing Located at: http://www.nanogune.eu/publications/2014?idPublication=2807.

(Continued)

*Primary Examiner* — Son Dinh

(57) ABSTRACT

To provide enhanced data storage devices and systems, various systems, architectures, apparatuses, and methods, are provided herein. In a first example, a resistive random access memory (ReRAM) array is provided. The ReRAM array includes a plurality of memory cells each comprising resistive memory material formed into a layer of a substrate, with resistance properties of the resistive memory material corresponding to data bits stored by the memory cells. The ReRAM array also includes a plurality of interconnect features each comprising conductive material between adjacent memory cells formed into the layer of the substrate, and gate portions coupled onto the memory cells and configured to individually alter the resistance properties of the resistive memory material of associated memory cells responsive to at least voltages applied to the gate portions.

14 Claims, 12 Drawing Sheets

(52) U.S. Cl.
CPC ...... *G11C 2213/52* (2013.01); *G11C 2213/53* (2013.01); *G11C 2213/71* (2013.01)

(56) References Cited

U.S. PATENT DOCUMENTS

| | | | |
|---|---|---|---|
| 7,002,837 | B2 | 2/2006 | Morimoto |
| 7,130,212 | B2 | 10/2006 | Bednorz et al. |
| 7,723,714 | B2 | 5/2010 | Karg et al. |
| 7,778,063 | B2 | 8/2010 | Brubaker et al. |
| 7,830,693 | B2 | 11/2010 | Liu et al. |
| 7,843,718 | B2 | 11/2010 | Koh et al. |
| 8,004,874 | B2 | 8/2011 | Xi et al. |
| 8,278,640 | B2 | 10/2012 | Lee et al. |
| 8,385,102 | B2 | 2/2013 | Xiao et al. |
| 8,466,444 | B2 | 6/2013 | Krusin-Elbaum et al. |
| 8,547,727 | B2 | 10/2013 | Wu et al. |
| 8,687,432 | B2 | 4/2014 | Hou et al. |
| 8,766,234 | B1 | 7/2014 | Hashim et al. |
| 8,804,398 | B2 | 8/2014 | Chung |
| 8,869,436 | B2 | 10/2014 | Tsai et al. |
| 9,019,743 | B2 | 4/2015 | Tsai et al. |
| 2006/0049435 | A1 | 3/2006 | Bill et al. |
| 2007/0007579 | A1 | 1/2007 | Scheuerlein et al. |
| 2007/0121369 | A1 | 5/2007 | Happ |
| 2008/0106926 | A1* | 5/2008 | Brubaker ............ H01L 27/2409 365/148 |
| 2010/0270593 | A1 | 10/2010 | Lung et al. |
| 2013/0001497 | A1 | 1/2013 | Ohba et al. |
| 2013/0161583 | A1 | 6/2013 | Blomme et al. |
| 2013/0221418 | A1* | 8/2013 | Mitchell ........... H01L 27/11517 257/296 |
| 2014/0169062 | A1 | 6/2014 | Lee et al. |
| 2014/0203237 | A1 | 7/2014 | Chien et al. |
| 2014/0301128 | A1 | 10/2014 | Park |
| 2015/0036415 | A1 | 2/2015 | Di Pendina et al. |
| 2015/0097155 | A1 | 4/2015 | Bateman |
| 2016/0020389 | A1 | 1/2016 | Ratnam et al. |
| 2016/0028009 | A1* | 1/2016 | Tan .................. H01L 45/16 257/2 |
| 2016/0064222 | A1 | 3/2016 | Konevecki |

OTHER PUBLICATIONS

Xu et al., Overcoming the Challenges of Crossbar Resistive Memory Architectures, 13 pages, downloaded on Apr. 27, 2016 Located at: http://www.cs.utah.edu/~rajeev/pubs/hpca15.pdf.

Lin et al., 3D vertical RRAM architecture and operation algorithms with effective IR-drop suppressing and anti-disturbance, IEEE International Symposium on Circuits and Systems (ISCAS), May 24-25, 2015, pp. 377-380 (Abstract provided) Located at: http://ieeexplore.ieee.org/stamp/stamp.jsp?tp=&arnumber=7168649&isnumber=7168553.

Das et al., Redox-gated three-terminal organic memory devices: effect-of-composition and environment on performance, ACS Appl Mater Interfaces, Nov. 13, 2013, 2 pages, vol. 5, No. 21 (Abstract provided) Located at: http://www.ncbi.nlm.nih.gov/pubmed/24117352.

Ye et al., Compact One-Transistor-N-RRAM Array Architecture for Advanced CMOS Technology, IEEE Journal of Solid-State Circuits, May 2015, 1 page, pp. 1299-1309, vol. 50, No. 5 (Abstract provided) Located at: http://ieeexplore.ieee.org/stamp/stamp.jsp?tp=&arnumber=7051296&isnumber=7098452.

Tanaka, H. et al, "Bit Cost Scalable Technology with Punch and Plug Process for Ultra High Density Flash Memory," 2007 IEEE Symposium on VLSI Technology, Kyoto, 2007, pp. 14-15.

Mellor, "HP and Hynix to Produce the Memristor Goods by 2013", Oct. 2011, The Register, retrieved from the web site: http://www.theregister.co.uk/2011/10/10/memristor_in_18_months/, 4 pages.

Li et al., "Variable-Relation Criterion for Analysis of the Memristor", 2011, World Academy of Science, Engineering and Technology, International Journal of Electrical, Computer, Energetic, Electronic and Communication Engineering, vol. 5, No. 12, 4 pages.

\* cited by examiner

PLANAR MEMORY CELL ARCHITECTURES IN RESISTIVE MEMORY DEVICES

TECHNICAL FIELD

Aspects of the disclosure are related to the field of data storage and resistive random access memory in data storage devices.

TECHNICAL BACKGROUND

Computer and network data systems such as personal computers, workstations, server systems, and cloud storage systems, typically include data storage devices for storing and retrieving data. These data storage devices can include hard disk drives (HDDs), solid state storage drives (SSDs), tape storage devices, optical storage drives, hybrid storage devices that include both rotating and solid state data storage elements, and other mass storage devices. Recently, new storage technologies have been developed which employ resistive memory elements. These resistive memory elements can include resistive random-access memory (RRAM or ReRAM), which are types of non-volatile random access memory that store data by altering a resistance of a solid-state material. However, ReRAM elements can be difficult to manufacture and incorporate into memory devices. Moreover, arrays of ReRAM employ two-terminal memory elements which do not integrate well into arrayed architectures.

OVERVIEW

To provide enhanced data storage devices and systems, various systems, architectures, apparatuses, and methods, are provided herein. In a first example, a resistive random access memory (ReRAM) array is provided. The ReRAM array includes a plurality of memory cells each comprising resistive memory material formed into a layer of a substrate, with resistance properties of the resistive memory material corresponding to data bits stored by the memory cells. The ReRAM array also includes a plurality of interconnect features each comprising conductive material between adjacent memory cells formed into the layer of the substrate, and gate portions coupled onto the memory cells and configured to individually alter the resistance properties of the resistive memory material of associated memory cells responsive to at least voltages applied to the gate portions.

In another example, a solid state data storage array is provided. The solid state data storage array comprises one or more wordlines each comprising resistive random access memory (ReRAM) elements connected in series by metallized interconnect. Each of the ReRAM elements comprise an active channel between a source and drain, the active channel comprising resistive memory material formed into a layer of a substrate, with resistance properties of the resistive memory material corresponding to data stored by the associated ReRAM element. The metallized interconnect of each of the wordlines comprising metallizing material introduced between adjacent ReRAM elements to establish a conductive link between the adjacent ReRAM elements. Each of the ReRAM elements also comprising a gate portion positioned proximate to the active channel and configured to alter the resistance properties of the active channel responsive to at least voltages applied to the gate portion.

In another example, a method of manufacturing a resistive random access memory (ReRAM) array is provided. The method includes forming a plurality of memory cells into a layer of a substrate by introducing a resistive memory material into the substrate, forming interconnect features into the layer of the substrate between adjacent memory cells by introducing a conductive material into the substrate, and forming gate portions onto the memory cells.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

High-density storage devices employ a variety of storage technologies. In the past, magnetic storage devices have been employed, such as hard disk drives with rotating magnetic media. More recently, solid state storage devices, such as flash drives employing NAND flash or other semiconductor-based memory technologies have become popular as associated densities have increased. Other storage technologies, such as optical and non-rotating magnetic technologies are also employed. However, resistive memory technologies have become possible using new materials which have alterable electrical properties, such as electrical resistance, that persist after application of an electric current. These resistive memory devices include memristors and other related devices. Memristors typically comprise two-terminal electrical components which relate electric charge to magnetic flux linkage, where an electrical resistance of a memristor depends upon a previous electrical current passed by the memristor. Although memristors can be incorporated into non-volatile memories, it has been difficult to incorporate arrays of these memristors into storage devices, in part due to difficulty in achieving addressable memory arrays.

As will be seen herein, various enhanced architectures and devices employ three-terminal resistive memory devices in various linear arrays, two-dimensional arrays, and three-dimensional arrays. In some examples, these three-terminal devices include gate, source, and drain terminals, with the gate terminal employed to alter persistent resistance properties, such as electrical resistances, between the source and drain terminals. These three-terminal devices can be referred to as resistive random-access memory (ReRAM) devices or ReRAM elements. Alternatively, a non-volatile 'memory' junction field effect (NVMJFET) transistor element can be employed. As discussed below, these resistive memory elements have three terminals and include resistive memory material in an active channel portion between source and drain terminals. The resistive memory material comprises flux linkage-controlled resistor material.

Figure 1:
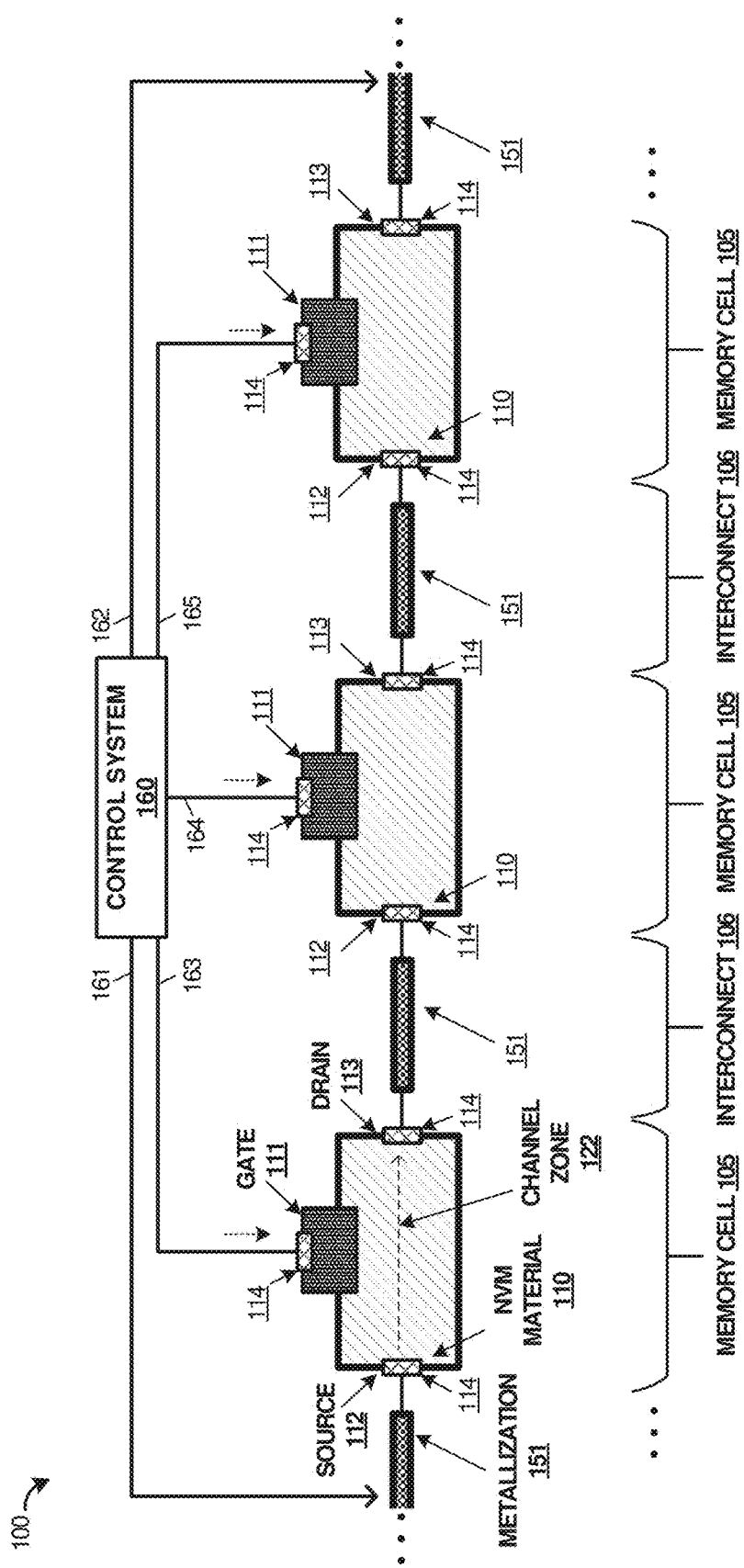
FIG. 1 is a system diagram illustrating a resistive memory array.

In a first example of a resistive memory storage array, FIG. 1 is presented. FIG. 1 is a system diagram illustrating resistive memory storage array 100. Array 100 illustrates an example linear array of resistive memory elements, each with an associated memory cell 105. Although only three example resistive memory elements are included in FIG. 1, it should be understood that any number can be arrayed into a liner arrangement as shown in FIG. 1. Each resistive memory element comprises a three-terminal configuration that includes gate 111, source 112, and drain 113. Each resistive memory element is interconnected with adjacent resistive memory elements via interconnect elements 106. Control system 160 is included to control each of the resistive memory elements for reading and writing of data bits into associated memory cells.

Turning first to each resistive memory element, an included memory cell 105 comprises non-volatile memory (NVM) material 110 in an associated channel zone 122. NVM material 110 comprises resistive memory material, with resistance properties of the resistive memory material able to be altered using at least an associated gate 111. As mentioned above, each ReRAM element includes gate 111, source 112, and drain 113, with optional terminal material 114 incorporated into each of gate 111, source 112, and drain 113. Each resistive memory element is linked by interconnect 151 which forms conductive links between each resistive memory element.

In write operations, control system 160 can apply a voltage individually to any of the gates over links 163-165 which will alter resistance properties of NVM material 110 in the associated channel zone 122. Altered resistance properties can be used to store data bits in memory cells, with values of the resistance properties, such as electrical resistances, indicating various bit values, such as a binary '1' or '0'—although multi-level bit logic can be employed to store many bits per memory cell depending upon the resistance properties.

In read operations, control system 160 can measure a series resistance across all of the memory cells 105 using links 161-162. This series resistance might not indicate the data stored by individual memory cells, as all three memory cells in this example would be measured in series. Further examples determine the resistance of each single device in the series chain by applying control voltages to the individual gates and measuring the resistance across links 161 and 162. Control system 160 can also measure individual memory cells by measuring resistances through individual gates, such as by measuring a resistance across link 161 and link 163. Further resistance measurements can be employed, such as across links 161/164 and links 162/165. These various resistance measurements can be processed to identify data bits stored in each memory cell, which can include comparing the series resistance of the entire array to individual gate-selected resistance measurements.

Figure 2:
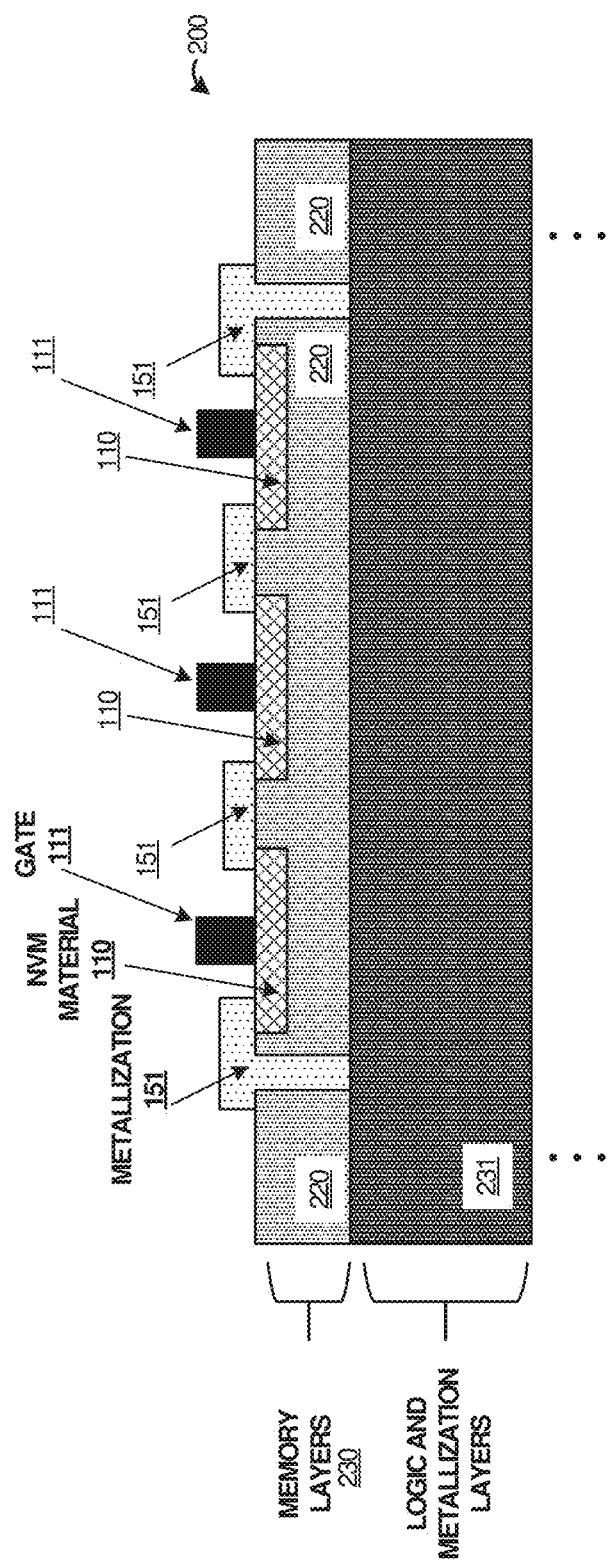
FIG. 2 is a system diagram illustrating a resistive memory array.

As a further example of an array of resistive memory elements, FIG. 2 is provided. FIG. 2 is a system diagram illustrating memory array 200. Memory layers 230 are formed on one or more logic and metallization layers 231, which can comprise semiconductor-based logic and metal interconnect of a logic circuit, processor, control system, or other elements which can at least control the elements of memory layers formed on top of layers 231. For example, when a semiconductor wafer is employed for creation of logic circuitry and associated interconnect in layers 231, then resistive memory array 200 can be formed in memory layers 230 on top of layers 231 using techniques found in semiconductor wafer processing and microfabrication, such as photo-lithography, diffusing, deposition, epitaxial growth, etching, annealing, and ion implanting, among others.

Specifically, logical and metallization layers 231 can be formed on a semiconductor substrate, such as a silicon wafer. Memory layers 230 can be built-up from layers 231 to form the memory arrays as discussed herein. Substrate 220 comprises an insulating material which isolates individual memory cells from each other. NVM material 110 can be diffused, annealed, or ion implanted into substrate 220 to form each memory cell of the resistive memory elements. A gate structure can be formed on top of each memory cell to allow for control of the resistive properties of the associated memory cell. In this manner, array 200 can be built on top of various semiconductor-based circuitry to allow for that circuitry to have nearby memory storage in a compact, layered, arrangement.

Figure 3A:
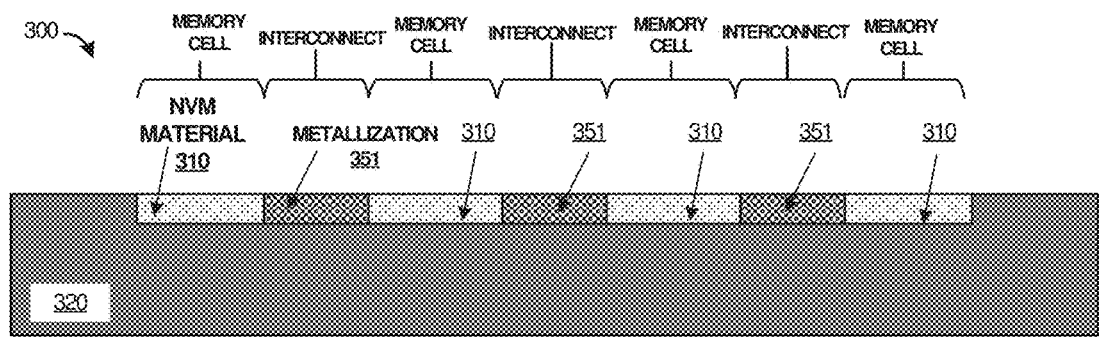
FIG. 3A illustrates manufacture of resistive memory arrays.
Figure 3B:
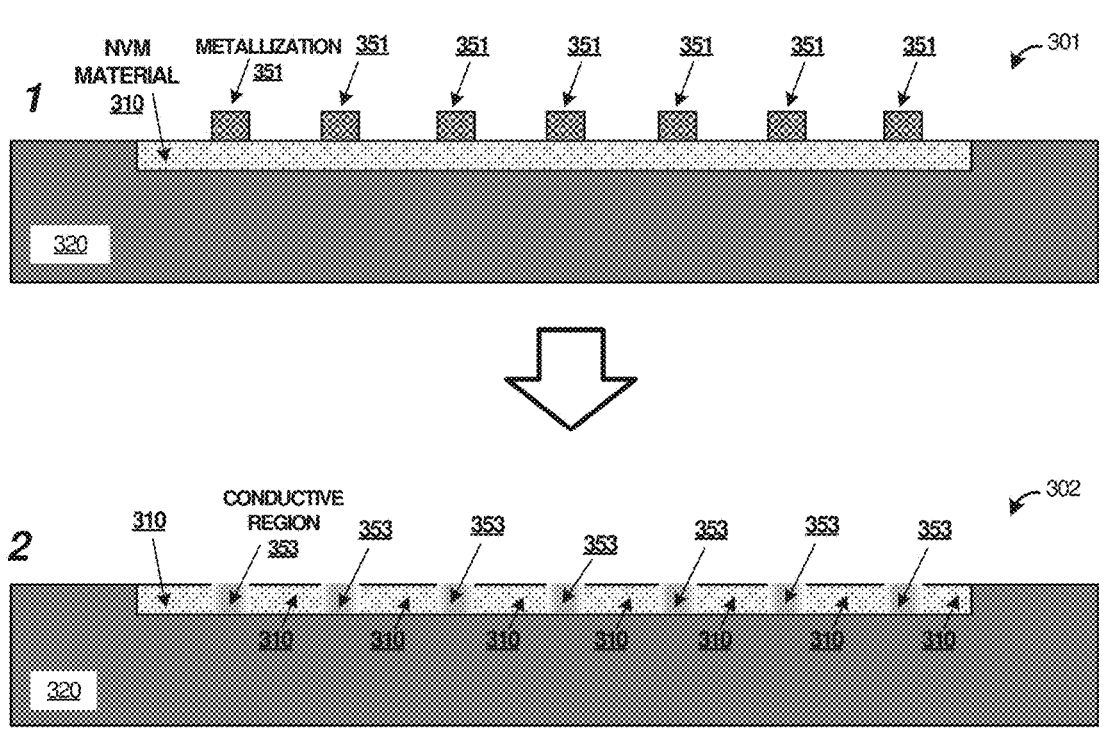
FIG. 3B illustrates manufacture of resistive memory arrays.

Metallization 151 can be included to interconnect each resistive memory element, with source terminals and drain terminals coupled in a series fashion. Metallization 151 comprises a high conductivity inactive material. In some examples, metallization 151 comprises metal ions implanted into intervening material between resistive memory cells. In other examples, metallization 151 comprises deposited metal or conductive material. FIGS. 3A and 3B show further examples of metallization and other features of resistive memory elements.

Figure 4:
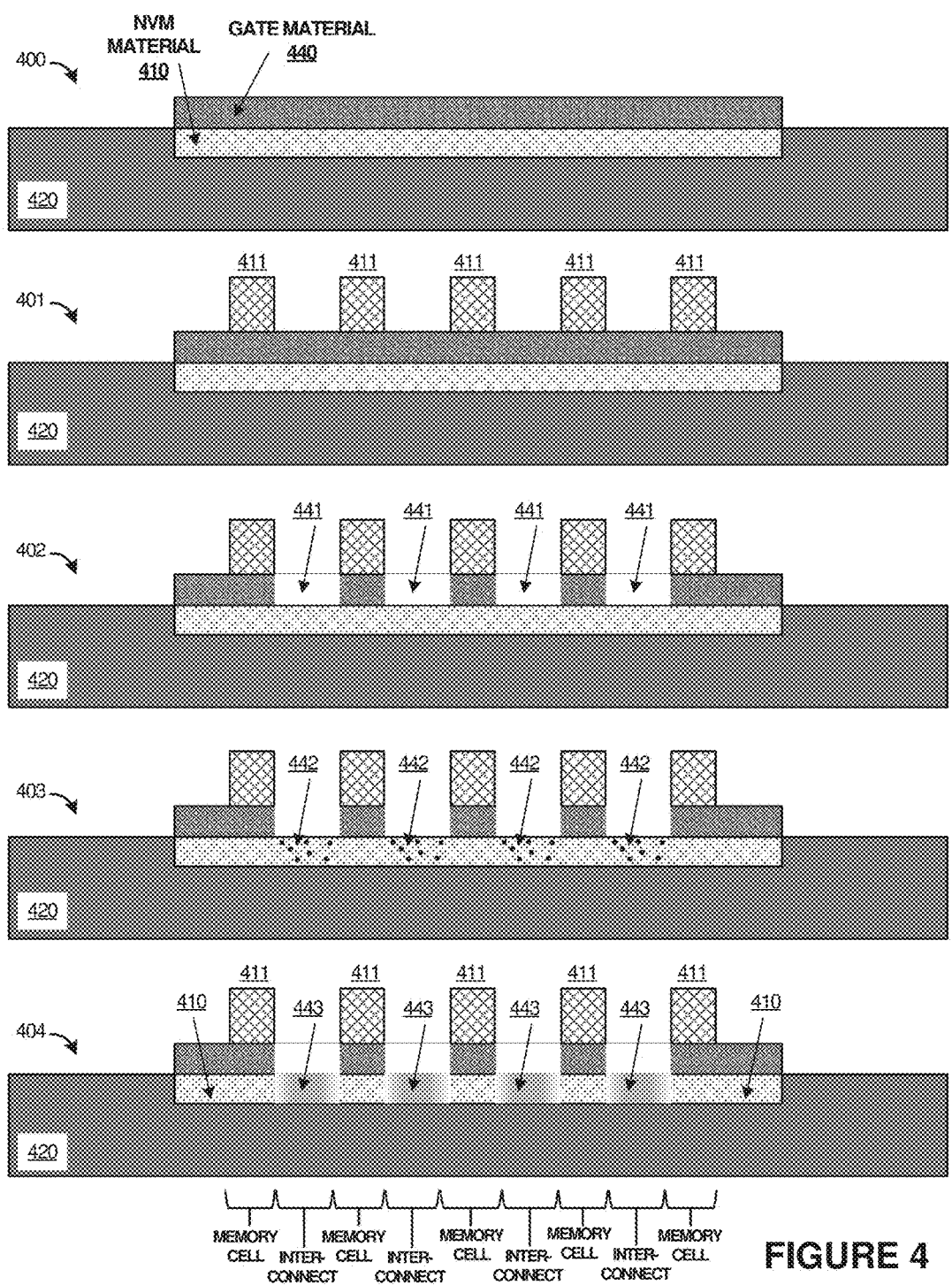
FIG. 4 illustrates manufacture of resistive memory arrays.

FIGS. 3A and 3B further discuss various manufacturing techniques to form resistive memory arrays. FIG. 3A shows a diffusion or ion implantation technique for creating memory cells, while FIG. 3B shows an annealing technique for creating memory cells. FIG. 4 shows a self-aligned process for creating resistive memory elements. It should be noted that the thicknesses and other dimensions of the various elements, layers, and materials employed herein can depend on properties of the specific materials employed, resistivity properties desired for the devices, manufacturing techniques employed, among other considerations.

Referring first to FIG. 3A, FIG. 3A includes memory array 300 which comprises insulating substrate 320. Substrate 320 can comprise insulating oxide material, such as oxides of silicon or other materials. NVM material 310 is deposited onto the surface of substrate 320 to form a strip of NVM material over the entire area of the array. Alternatively, the material 320 can be doped or otherwise chemically modified to form NVM material 310. Then, portions of the strip of NVM material are metallized by introducing high-conductivity inactive material in-between areas designated as memory cells. In this manner, the material introduced into substrate 320 can be broken into portions with high-conductivity portions connecting memory cell portions. Gate elements can be formed on top of the memory cell portions.

In another example of FIG. 3A, substrate 320 can be deposited over a sublayer, such as semiconductor layers, and NVM material 310 can be diffused into a top surface of substrate 320. A diffusion into substrate 320 or a complete layer can be formed of the NVM material. Then, a selective diffusion of conductive material is performed to introduce the conductive material into the layer of NVM material at selective regions to interconnect memory cells. Gate material can be patterned on top of the memory cells, and all associated elements can be interconnected with control circuitry, such as within the sublayer of semiconductor.

In one example, the resistive memory material comprises a first oxide of tantalum with an associated first 'x' quantity of oxygen atoms ($TaO_x$), the conductive material comprises a second oxide of tantalum with an associated second 'y' quantity of oxygen atoms ($TaO_y$), where 'y' is a number less than 'x'. Likewise, the substrate can comprise an insulating oxide of tantalum, such as $Ta_2O_5$. In other words, the resistive memory material can comprise $TaO_x$, where the conductive material comprises $TaO_y$, with y comprising a number less than x, and where the substrate comprises $Ta_2O_5$ FIG. 3B shows an alternate manufacturing process. In configuration 301, NVM material 310 has been introduced into substrate 320, such as mentioned above. Metallization 351 is patterned onto the surface of NVM material 310, and then an anneal process is performed to bring metallization 351 into the NVM material to make those portions of the NVM material permanently conductive. Instead of an anneal process, ion implantation or chemical reduction can be used. Gate material can be patterned on top of the memory cells, and all associated elements can be interconnected with control circuitry, such as within the sublayer of semiconductor.

FIG. 4 illustrates another example manufacturing process. In a first step 400, a substrate 420 is formed, such as on top of a sublayer of semiconductor circuitry or metallization associated with the semiconductor circuitry. A layer of NVM material 410 is deposited on top of or into substrate 420. Then gate material 440 is layered on top of NVM material 410. In step 401, wordline material 411 is patterned on top of gate material 440 as shown in FIG. 4. In step 402, etching processes create voids 441 to define gate structures with attached wordline material 411. Step 403 illustrates ion implantation of conductive material 442 into the spaces between memory cells. This ion implantation is self-aligned due to the existing gate structures and wordline material. Finally, step 404 illustrates a diffusion step which makes NVM material inactive to form interconnect 443 and establishes low resistance electrodes between memory cells formed by the active NVM material under each gate structure.

Figure 5:
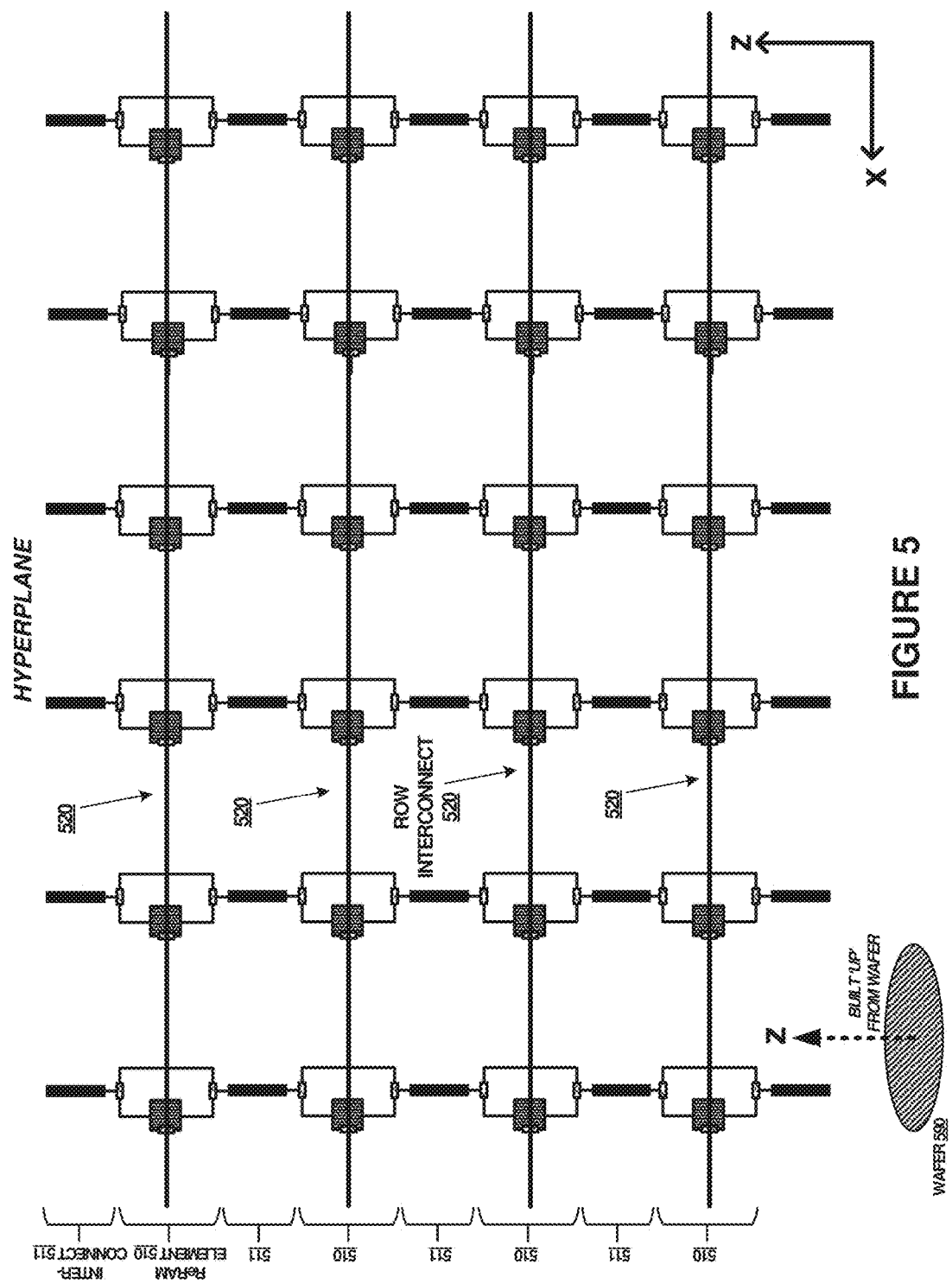
FIG. 5 is a system diagram illustrating a multi-layered resistive memory array.

FIG. 5 is provided to illustrate a two-dimensional array of resistive random access memory (ReRAM) elements 510, which form a hyperplane in FIG. 5. Six columns in the 'z' direction of ReRAM elements are shown, with gate portions of each resistive memory element coupled over row interconnects 520 in the 'x' direction. In some examples row interconnects 520 comprise wordlines. ReRAM elements of a particular column are interconnected in series with interconnect 511. In some examples, interconnect 511 comprises bitlines.

FIG. 5 can illustrate an array of vertically-layered columns built up from a wafer, such as in the vertical 'z' direction from wafer 590. Further examples below illustrate further examples of this. In alternative examples, FIG. 5 can illustrate a top-view of a 2-D plane of ReRAM elements connected with wordlines and bitlines, with the 'x' and 'z' direction lying parallel to a surface of wafer 590.

Figure 6:
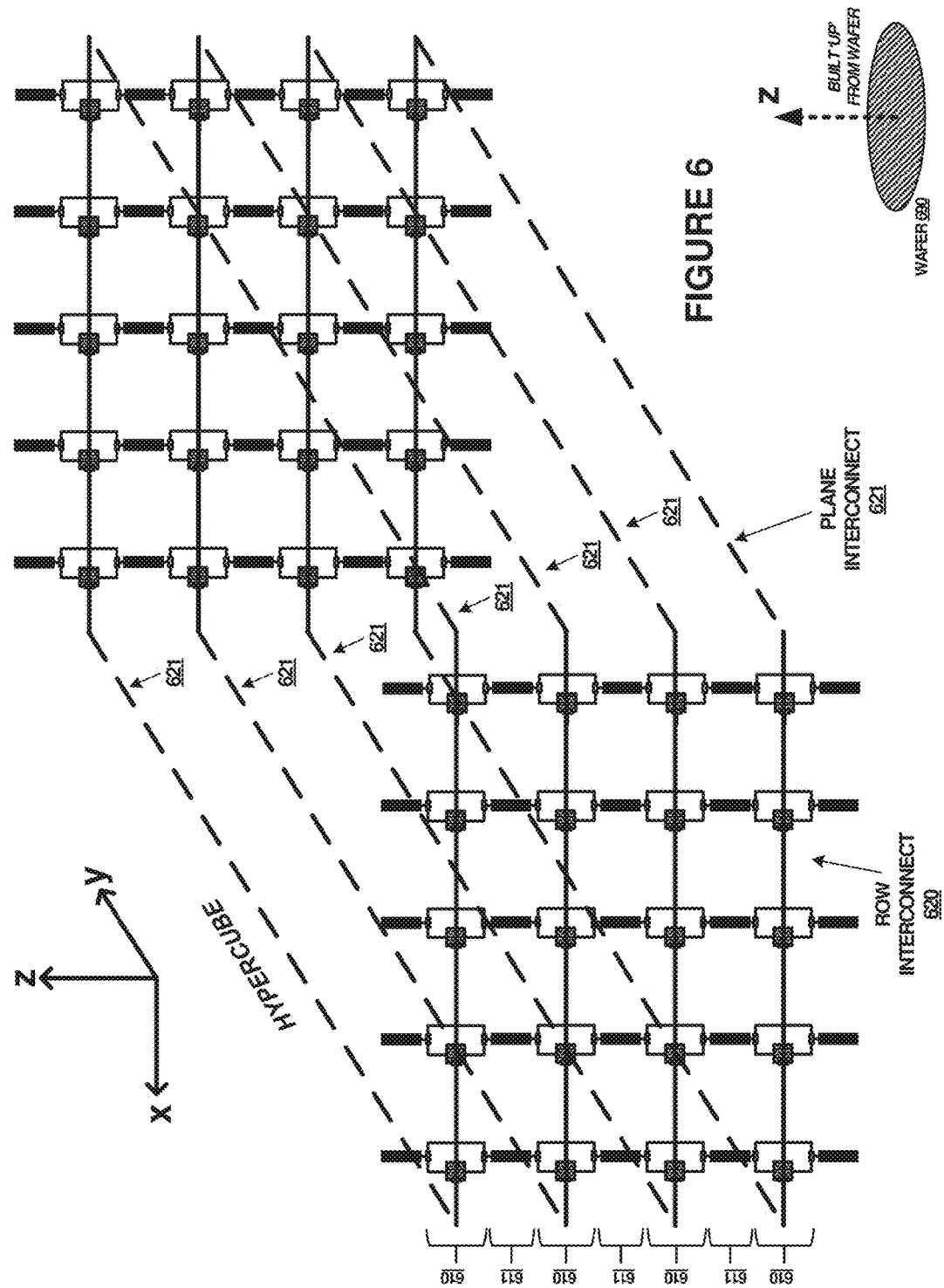
FIG. 6 is a system diagram illustrating a multi-layered resistive memory array.

FIG. 6 illustrates a multi-layered, three-dimensional arrangement of ReRAM elements 610 interconnected in columns by interconnect 611. FIG. 6 shows a hypercube arrangement with at least two hyperplanes of ReRAM elements connected via plane interconnect links 621. Plane interconnect links 621 and row interconnect links 620 can form individual wordlines for each plane that is formed along the vertical axis. Interconnect 611 can form individual bitlines. FIG. 6 can thus illustrate an array of vertically-layered planes built up from a wafer, such as in the vertical 'z' direction from wafer 690.

Figure 7:
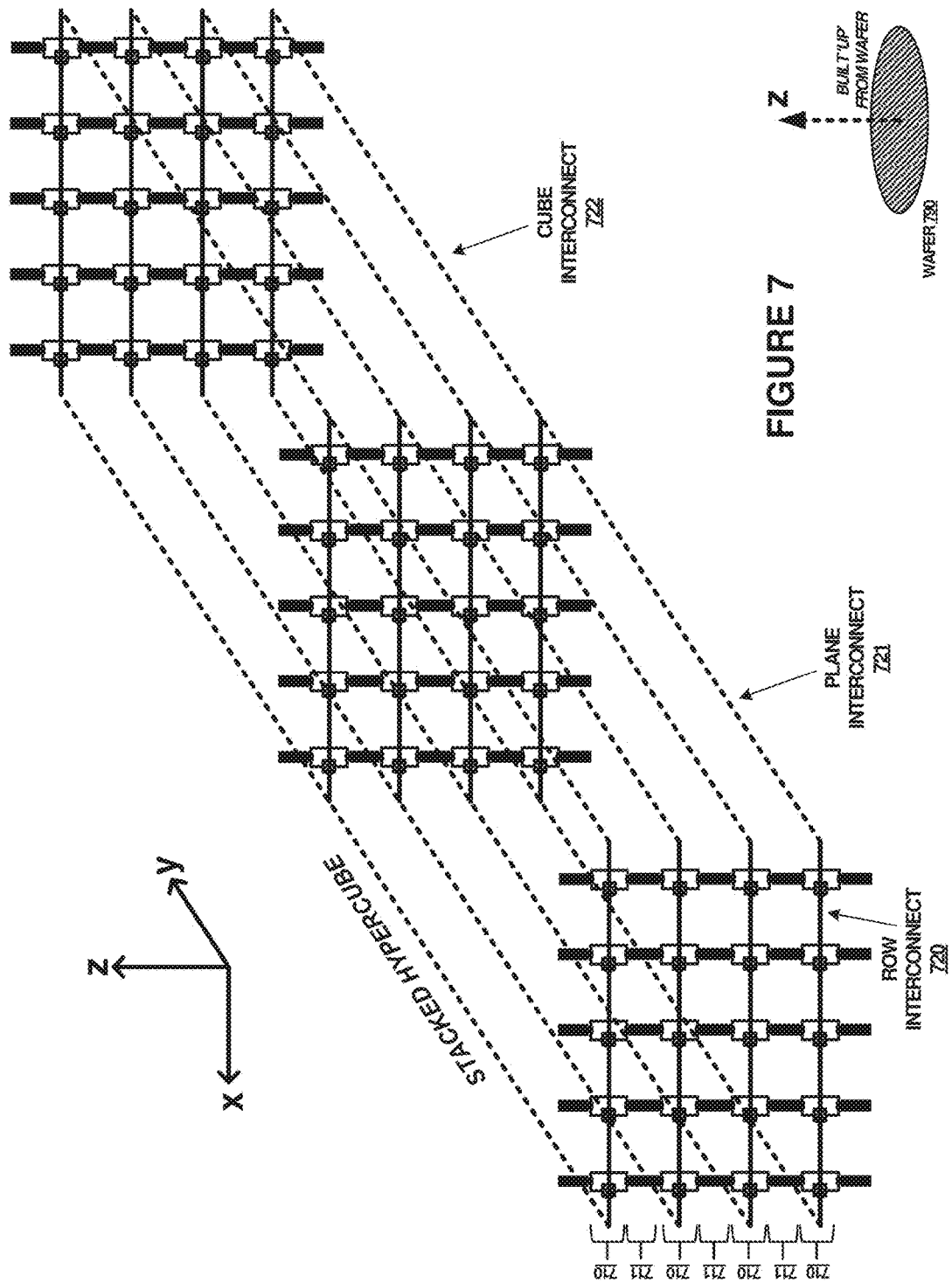
FIG. 7 is a system diagram illustrating a multi-layered resistive memory array.

FIG. 7 illustrates a multi-layered, three-dimensional arrangement of ReRAM elements 710 interconnected in columns by interconnect 711. FIG. 7 shows a stacked hypercube arrangement with at least two hypercubes of ReRAM elements connected via cube interconnect links 722. Cube interconnect links 722, plane interconnect links 721, and row interconnect links 720 can form individual wordlines for each plane that is formed along the vertical axis. Interconnect 711 can form individual bitlines. FIG. 7 can thus illustrate an array of vertically-layered planes built up from a wafer, such as in the vertical 'z' direction from wafer 790.

Figure 8:
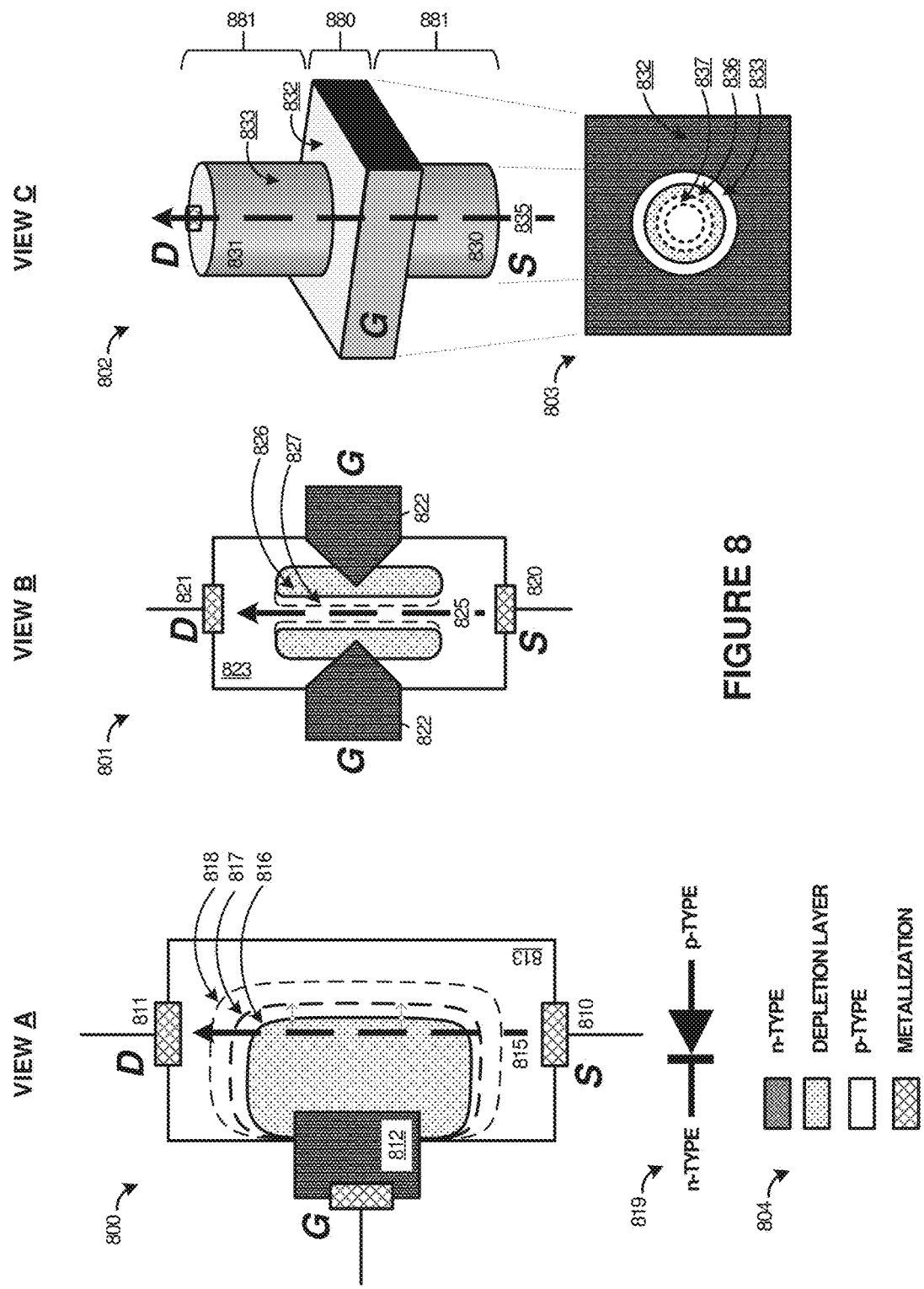
FIG. 8 includes diagrams illustrating three-terminal resistive memory devices.

FIG. 8 includes various views illustrating three-terminal resistive memory devices. In a first view 'A', a schematic representation of a three-terminal resistive memory device 800 is shown. In a second view 'B', a side-view sectioned representation of a 3D three-terminal resistive memory device 801 is shown. In a second view 'C', an isometric view of a 3D three-terminal resistive memory device 802 is shown, along with a top view to illustrate various elements of device 802. Devices 800-802 can each comprise ReRAM devices as discussed above, which can also be referred to as a non-volatile 'memory' junction field effect (NVMJFET) transistors. Although each of the gate/source/drain elements in FIG. 8 includes a conductive terminal portion indicated by the rectangular crosshatching, in some examples these conductive terminal portions can be omitted. When employed, the conductive terminal portions can comprise metallized material or metal material, among other material, such as polycrystalline silicon material.

Referring first to view A, device 800 includes a source element (S) 810, a drain element (D) 811, a gate element (G) 812, and an active channel 815 formed in memory cell material 813. Diode-style junctions and Schottky barriers can be fabricated not only from classical semiconductors, but also from oxidic materials, such as metal oxide materials. Gate 812 might comprise a material that forms a rectifying junction or Schottky barrier with the material of memory cell 813, which isolates the gate and acts as a selector. When diode-style junctions or Schottky barriers are employed, a resistance level can be measured through the gate associated with a memory cell, as current can flow from the resistive memory material of the channel through the gate (or vice versa in oppositely formed junction or barriers), but not in reverse due to the junction or barrier. In other examples, no rectifying junction or Schottky barrier is formed between gate and channel. In this case, the gate is not electrically isolated from the channel, and resistance values for a memory cell can be measured from gate-to-channel.

As shown in this example and indicated by legend 804, the gate material can comprise n-type semiconductor, such as an n-type polycrystalline silicon material. The memory cell 813 might comprise a p-type material, which would form a PN rectifying junction from memory cell-to-gate, as shown in FIG. 8. Other examples include where gate material can comprise a p-type semiconductor, such as a p-type silicon material, and the memory cell 813 might comprise a n-type material, which would form a NP rectifying junction from memory cell-to-gate. It should be understood that the materials selected for the memory cell can be selected to exhibit different dopant-type properties than the gate, even though silicon semiconductor materials are not employed for the memory cell. Specifically, when the gate is formed from p-type silicon material, then the material employed in the memory cell can be selected to exhibit n-type properties. Conversely, when the gate is formed from p-type silicon material, then the material employed in the memory cell can be selected to exhibit n-type properties.

In a non-memory FET or JFET devices, voltage applied to a gate element controls current flow between source and drain. However, these non-memory FET devices, when the gate voltage is removed, then behavior between the source and drain returns to an inactive state. Thus, a non-memory FET can be considered a voltage controlled resistor. In the resistive memory devices herein, such as shown in device 800, a structure similar to a FET is shown however instead of being a voltage controlled resistor, the memory-enabled FET is a flux linkage controlled resistor.

By applying a gate (G) 812 voltage, a depletion or enhancement zone moves in and out of an active channel between source (S) 810 and drain (D) 811 and affect a resistance measured across active channel 815 between source 810 and drain 811. This depletion of enhancement zone persists after a voltage is removed from the gate, and thus a memory effect is achieved. In view A, three different encroachments of a depletion layer or depletion zone are shown, which can correspond to different voltage levels applied to gate 812. A first depletion layer configuration 816 corresponds to a first voltage level applied to gate 812, a second depletion layer configuration 817 corresponds to a second voltage level applied to gate 812, and a third depletion layer configuration 818 corresponds to a third voltage level applied to gate 819. The level of encroachment of the depletion layer into memory cell 813 can correspond to a different bit level or data stored in the memory cell. In some examples, a binary representation is employed, with only a '1' and '2' configuration for memory cell. In other examples, a multi-bit representation is employed, with graduated levels of depletion layers corresponding to various data bits. Thus, each memory cell can store one bit or multiple bits, depending upon desired operation and material composition.

The resistive memory material of memory cell 813 which can form channel 815 can be composed of various materials, typically a flux linkage controlled resistor material. In one example, the resistive memory material comprises an oxide of tantalum with an associated 'x' quantity of oxide portions ($TaO_x$), which is further discussed in an example above. Other examples can have the resistive memory material comprising doped $CuInO_2$, simple or complex transition metal oxides (e.g. CuOx, PCMO, HfOx, TaOx, RuOx), delafossites. NiO, $TiO_2$, $ZrO_2$, or mixed oxides with Yttrium. Scandium, and WOx. Further example resistive memory materials can include ones formed with Mott transition materials or Schottky barrier materials. Other materials are possible, including combinations thereof.

Referring now to view B, which shows a cross-sectioned view of a vertical ReRAM device, device 801 includes a source element (S) 820, a drain element (D) 821, a gate element (G) 822, and a memory cell 823. This view illustrates a vertically-oriented ReRAM device, such as shown in view C, among others. In view B, gate 822 surrounds a central memory cell 823, with gate 822 comprising a ring or cubic shape that envelops a central spire of memory cell 823. The shape of the gate material can vary so as to not be protruding into memory cell 823 in some examples. Example depletion layers 826 and 827 are shown in view B to illustrate how channel 825 might be affected by changes in voltage applied to gate 822.

Referring now to view C, which shows an isometric view of a three-dimensional (3D) ReRAM element, device 802 includes a source element (S) 830, a drain element (D) 831, a gate element (G) 832, and a memory cell 833. A top or bottom view 803 is also included to show a cross-sectional view of the internals of device 802. As can be seen in view C, gate 832 surrounds a central memory cell 833 which spans from source 830 to drain 831 to provide active channel 835. Example depletion layers 836 and 837 are shown in view C to illustrate how channel 835 might be affected by changes in voltage applied to gate 832. In some examples, view B can be representative of a side view cross-section of device 802. As will be seen in FIG. 9, these devices 802 can be formed into a layered arrangement of planes which advantageously allow for high-density packing of memory elements.

The active region for storing data in device 802 can be just proximate to gate 832, such as indicated by region 880 in FIG. 8. Interconnect portions can comprise regions 881 in FIG. 8. In such examples, source 830 and drain 831 would be located nearer to the gate portion and active region. However, in other examples, active region can span one or more portions of regions 880-881, including the entirety of regions 880-881.

Figure 9:
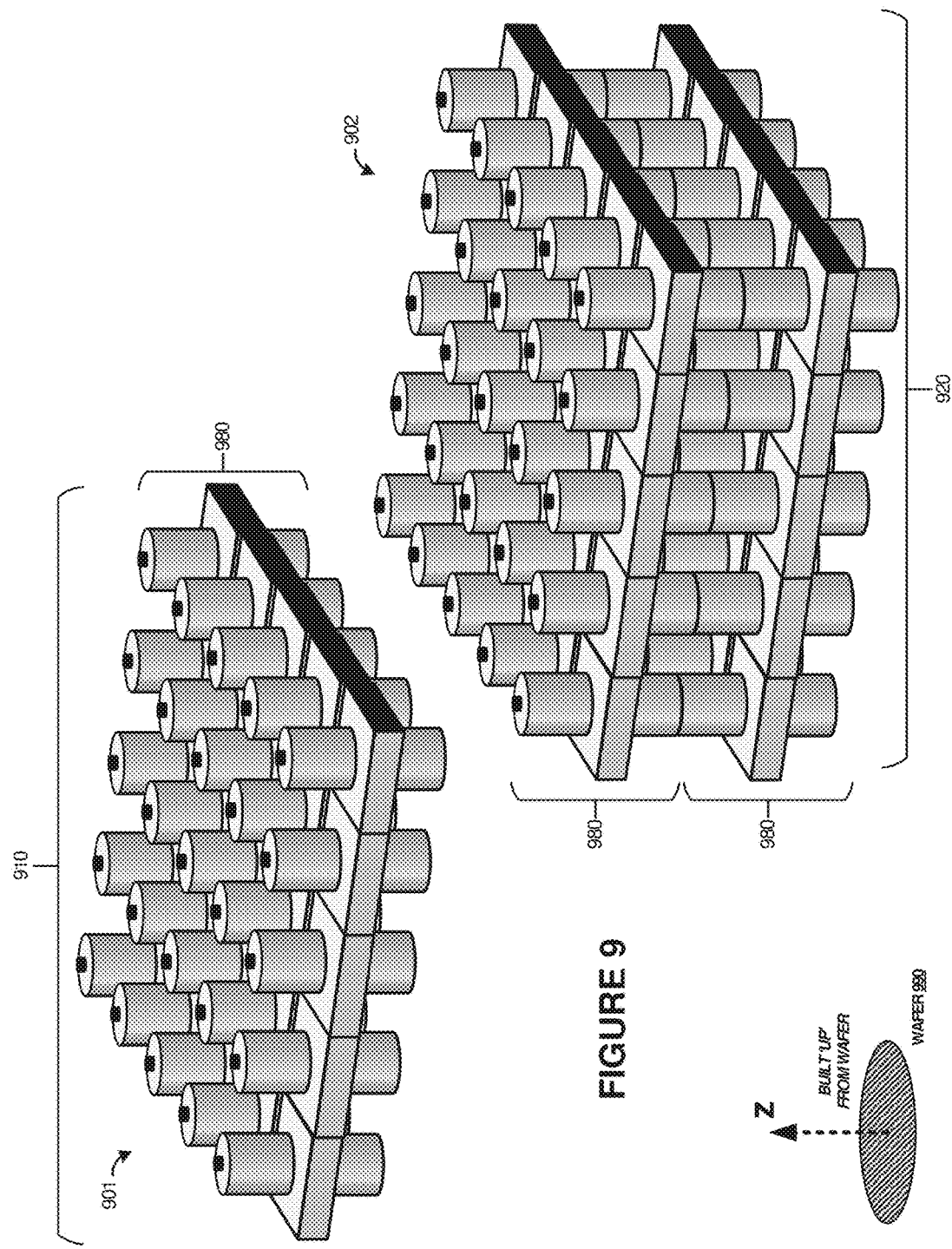
FIG. 9 includes diagrams illustrating a multi-layered resistive memory array.

FIG. 9 illustrates two isometric views of 3D-stacked resistive memory elements, such as device 802 in FIG. 8. In view 901, a single layer 980 or single plane of ReRAM devices are arranged into array 910, with gate portions connected to form an electrically connected plane which can comprise a 'wordline' of the array. Vertical connections through each ReRAM device comprise bitlines. In other examples, rows of ReRAM devices can be employed with wordlines coupling individual rows of ReRAM devices instead of an entire plane of devices. As will be seen below, these devices can be layered using various micro-manufacturing techniques, such as photo-lithography, deposition, epitaxial growth, etching, annealing, diffusion, ion implantation, and other techniques.

Multiple planes or layers of devices can be achieved, such as shown in view 902. View 902 includes at least two layers 980 or planes of ReRAM devices are arranged into array 920, with gate portions of each layer connected to form electrically connected planes which can comprise 'wordlines' of the array. Vertical connections through ReRAM devices comprise bitlines. In other examples, rows of ReRAM devices can be employed with wordlines coupling individual rows of ReRAM devices instead of an entire plane of devices.

The quantity of layers or planes is limited only by the material processes and manufacturing techniques employed, and can number in the dozens or higher. Thus, a high-density, 3D stacked, memory array can be created. In one example, the layers are built up from wafer 990 in the vertical or 'z' direction to form columnar bitlines and planar wordlines, allowing for efficient addressability of the ReRAM devices for reading and writing.

Figure 10:
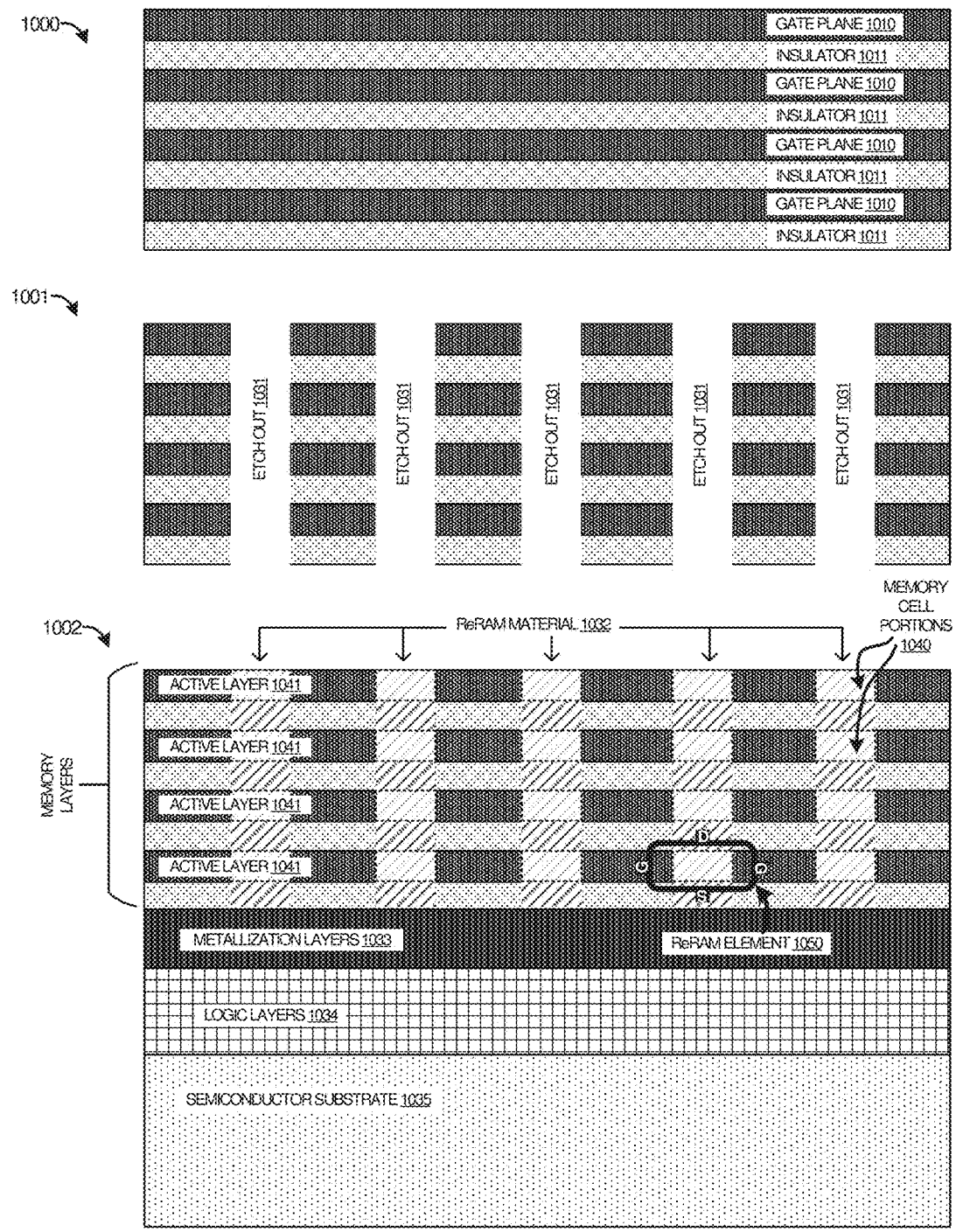
FIG. 10 illustrates manufacture of multi-layered resistive memory arrays.

FIG. 10 illustrates an example manufacturing process for a multi-layered or 3D resistive memory array. The compositions of each of the elements of FIG. 10 can comprise any of the materials mentioned herein for associated use in gate materials, insulator materials, resistive memory materials, and metallization materials. In a first view, 1000, a series of interleaved layers is formed onto a substrate, with insulator layers 1011 alternating with gate plane layers 1010. As seen in view 1002, these layers can be formed onto a sublayers comprising metallization layers 1033, logic layers 1034, and further substrates such as semiconductor substrate 1035 or a semiconductor wafer. The sublayers are omitted in views 1000 and 1001 for clarity.

In view 1001, etch-outs 1031 are formed by etching out material vertically through the gate planes and insulator planes for form columnar voids through the memory layers. Then, in view 1002, resistive memory material (ReRAM material 1032) is filled into the voids created by etch-outs 1031, such as by various deposition, epitaxial growth, or other techniques discussed herein.

View 1002 shows completed ReRAM structures in a multi-layered or 3D stacked array. Active layers 1041 of the multi-layer ReRAM array each comprise a plurality of ReRAM elements 1050 that each include a gate portion formed from material of the gate plane. Each of the ReRAM elements have a gate terminal (G) and a memory cell portion 1040 with a source terminal (S) and drain terminal (D). Insulating layers 1011 of the multi-layer ReRAM array alternate with the active layers 1041 and insulating material is included between adjacent active layers. A plurality of wordlines span through more than one layer of the multi-layer ReRAM array, with each of the wordlines comprising a column of memory cell portions communicatively coupled via at least source terminals and drain terminals of column-associated ReRAM elements. For example, in FIG. 10, a vertical collection of ReRAM elements 1050 can comprise a wordline. A plurality of bitlines is provided, each spanning within an associated active layer of the multi-layer ReRAM array, with each of the bitlines comprising a row or plane of gate portions communicatively coupled via at least gate terminals of row/plane-associated ReRAM elements.

Figure 11:
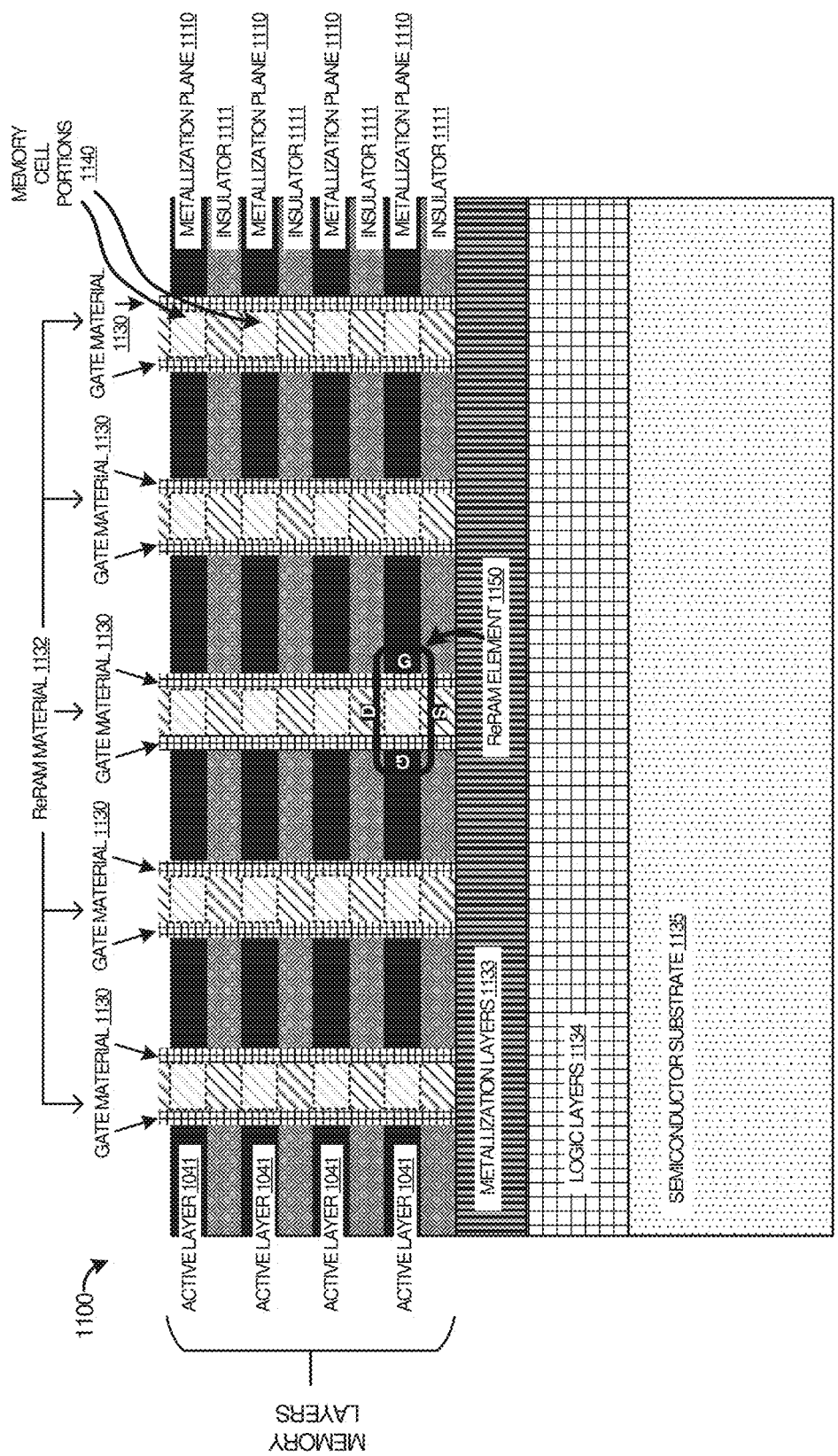
FIG. 11 illustrates manufacture of multi-layered resistive memory arrays.

FIG. 11 illustrates another example manufacturing process for a multi-layered or 3D resistive memory array. The compositions of each of the elements of FIG. 11 can comprise any of the materials mentioned herein for associated use in gate materials, insulator materials, resistive memory materials, and metallization materials. Similar procedures as found in FIG. 10 can be followed through view 1001. However, instead of insulating layers alternating with gate layers, FIG. 11 shows insulator planes 1111 interleaved with metallization planes 1110, which can be formed similarly to the planes of FIG. 10. Also, instead of filling the etch-outs 1031 in view 1001 of FIG. 10 with resistive memory material, FIG. 11 illustrates a two-step process. First, a layer of gate material 1130 is deposited onto the inner edges of the etch-out voids, where a specified thickness of the gate material is used to ensure proper control of the resistive properties of associated resistive memory material. ReRAM memory material 1132 is then deposited into the remaining void after the gate material has been deposited to a desired thickness. As seen in FIG. 11, these memory layers can be formed onto a sublayers comprising metallization layers 1133, logic layers 1134, and further substrates such as semiconductor substrate 1135 or a semiconductor wafer.

FIG. 11 shows completed ReRAM structures 1150 in a multi-layered or 3D stacked array similar to as constructed in FIG. 10 but with less gate material employed. Active layers of the multi-layer ReRAM array each comprise a plurality of ReRAM elements 1150 that each include a gate portion formed from deposited gate material 1130. Each of the ReRAM elements have a gate terminal (G) and a memory cell portion 1140 with a source terminal (S) and drain terminal (D). Insulating layers 1111 of the multi-layer ReRAM array alternate with the metallization layers 1110 and insulating material is included between adjacent active layers.

One or more wordlines each comprising ReRAM elements are connected in series by metallized interconnect. The metallized interconnect of each of the wordlines comprising metallizing material introduced between adjacent ReRAM elements to establish a conductive link between the adjacent ReRAM elements. Each of the ReRAM elements comprises a gate portion positioned proximate to the active channel and configured to alter the resistance properties of the active channel responsive to at least voltages applied to the gate portion. Each of the active channels are enveloped by gate material that isolates the active channels from at least the metallization planes. The plurality of wordlines span through more than one layer of the multi-layer ReRAM array, with each of the wordlines comprising a column of memory cell portions communicatively coupled via at least source terminals and drain terminals of column-associated ReRAM elements. For example, in FIG. 11, a vertical collection of ReRAM elements 1150 can comprise a wordline. A plurality of bitlines is provided, each spanning within an associated active layer of the multi-layer ReRAM array, with each of the bitlines comprising a row or plane of gate portions communicatively coupled via at least metallization planes 1110.

Figure 12:
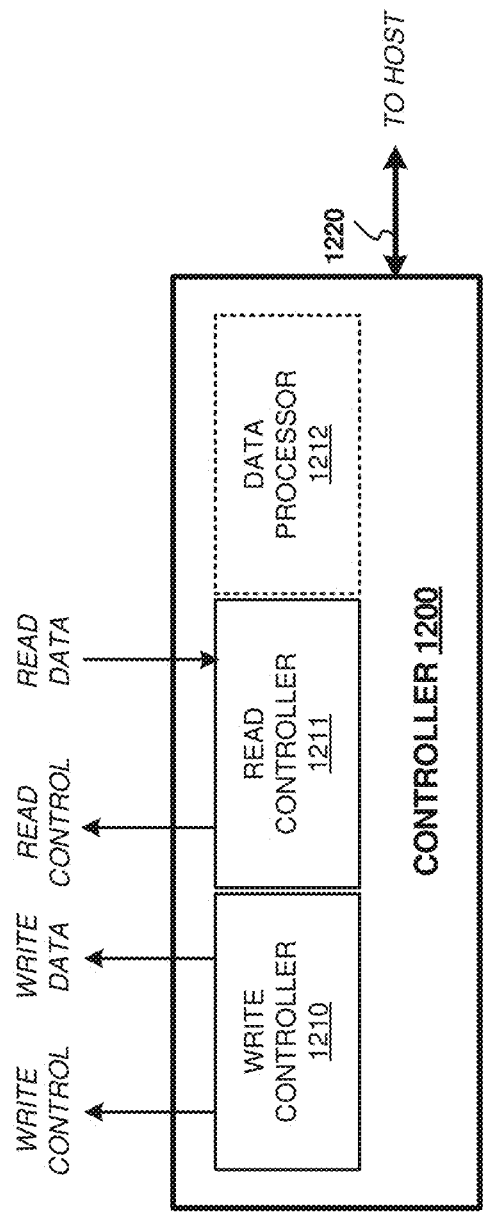
FIG. 12 is a block diagram illustrating a resistive memory array controller.

FIG. 12 illustrates controller 1200 that is representative of any logic, control systems, or collection of logic and systems in which the various resistive memory read, write, and other operational architectures, scenarios, and processes disclosed herein may be implemented. For example, controller 1200 can be employed in control system 160 of FIG. 1, or any of the sublayer logic employed in the various figures. Some features of controller 1200 can be incorporated into further devices and systems, such as external controllers, logic modules, microprocessors, computing devices, or distributed computing devices, as well as any variation or combination thereof.

Controller 1200 may be implemented as a single apparatus, system, or device or may be implemented in a distributed manner as multiple apparatuses, systems, or devices. For example, controller 1200 can comprise one or more application-specific integrated circuits (ASICs), field-programmable gate arrays (FPGA), or discrete logic and associated circuitry, including combinations thereof. Although not shown in FIG. 12, controller 1200 can include communication interfaces, network interfaces, user interfaces, and other elements for communicating with a host system over communication link 1220. Controller 1200 may optionally include additional devices, features, or functionality not discussed for purposes of brevity.

Controller 1200 can also comprise or communicate with one or more microcontrollers or microprocessors with software or firmware included on computer-readable storage media devices. If software or firmware is employed, the computer-readable storage media devices may include volatile and nonvolatile, removable and non-removable media implemented in any method or technology for storage of information, such as computer readable instructions, data structures, program modules, or other data. Examples of storage media include random access memory, read only memory, magnetic disks, resistive memory devices. ReRAM devices, optical disks, flash memory, virtual memory and non-virtual memory, magnetic cassettes, magnetic tape, magnetic disk storage or other magnetic storage devices, or any other suitable storage media.

Controller 1200 includes various controller portions to control resistive memory arrays, namely write controller 1210, read controller 1211, and optionally data processor 1212. Write controller 1210 writes data into resistive memory devices discussed herein, such as by using gate features or gate terminals of resistive memory devices. Write control signaling can include bitlines and wordlines which are used to uniquely address a resistive memory device to write data into that resistive memory device. In some examples, only entire wordlines are addressable and thus an entire wordline of data is written into associated resistive memory devices simultaneously. Read controller 1211 reads data stored in resistive memory devices. The read process can include measuring resistance properties of ones of the resistive memory devices. For example, read controller 1211 is communicatively coupled to ends of wordlines or the resistive memory devices and measure at least a series resistance property of each of the wordlines. Read controller 1211 can also be communicatively coupled to ends of the bitlines of the resistive memory devices and individually select ones of the bitlines to measure an associated resistance property of a subset of the resistive memory devices as a series resistance property through a bitline-selected gate portion and a selected wordline. Read controller 1211 can determine data stored by ones of the resistive memory devices by at least processing the series resistance property of a wordline that contains the at least the resistive memory devices being read and a resistance property of a subset of the resistive memory devices being read. Other techniques can be employed to measure and read data from each of the resistive memory devices. Data processor 1212 is optionally included to further process data, such as to arrange data into logical arrangements including words, pages, and the like, before transfer to a host over link 1220. Data processor 1212 can also be configured to perform encoding/decoding or encryption/decryption operations with respect to the data stored in an associated resistive memory array.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A resistive random access memory (ReRAM) array, comprising:
   memory cells each comprising resistive memory material formed into a layer of a substrate and having alterable resistance properties corresponding to one or more stored data bits;
   conductive interconnect features formed into the layer of the substrate between adjacent memory cells; and
   gate portions coupled onto corresponding ones of the memory cells and configured to individually alter the resistance properties of the resistive memory material responsive to at least voltages applied to the gate portions.

2. The ReRAM array of claim 1, wherein at least one of a Schottky barrier and a rectifying junction is formed between each of the gate portions and associated memory cells.

3. The ReRAM array of claim 1, wherein the memory cells are formed by introducing the resistive memory material into the layer of the substrate, and wherein the conductive interconnect features are each formed by introducing conductive material into the layer of the substrate to conductively connect the adjacent memory cells.

4. The ReRAM array of claim 1, wherein the gate portions comprise an n-type semiconductor material and the resistive memory material comprises a p-type metal oxide material.

5. The ReRAM array of claim 1, wherein the gate portions comprise a p-type semiconductor material and the resistive memory material comprises an n-type metal oxide material.

6. The ReRAM array of claim 1, wherein the resistive memory material comprises a flux linkage controlled resistor material.

7. The ReRAM array of claim 1, comprising:
   a semiconductor sublayer on which the substrate is layered, the semiconductor sublayer comprising logic circuitry configured to control at least the ReRAM array.

8. The ReRAM array of claim 1, comprising:
   the memory cells forming a data line of a data array, with ends of the data line communicatively coupled to control circuitry configured to read a series resistance property of the data line comprising the memory cells.

9. The ReRAM array of claim 1, comprising:
   the memory cells forming a data line of a data array, with the gate portions of the data line individually selectable by control circuitry to measure an associated resistance property of at least a subset of the memory cells in series with selected gate portions through an end of the data line.

10. A solid state data storage array, comprising:
    one or more wordlines each comprising resistive random access memory (ReRAM) elements connected in series by metallized interconnect;
    each of the ReRAM elements comprising an active channel between a source and drain, the active channel comprising resistive memory material introduced into a layer of a substrate, with resistance properties of the resistive memory material corresponding to data stored by the associated ReRAM element;
    the metallized interconnect of each of the wordlines comprising metallizing material introduced into the layer of the substrate between adjacent ReRAM elements to establish a conductive link between the adjacent ReRAM elements; and
    each of the ReRAM elements comprising a gate portion positioned proximate to the active channel and configured to alter the resistance properties of the active channel responsive to at least voltages applied to the gate portion.

11. The solid state data storage array of claim 10, comprising:
    the active channels formed by at least one of diffusing, annealing, and ion implanting the resistive memory material into the layer of the substrate, and the metallized interconnect features each formed by at least one of diffusing, annealing, and ion implanting the metallizing material into the layer of the substrate to conductively connect adjacent ReRAM elements.

12. The solid state data storage array of claim 10, comprising:

a semiconductor sublayer on which the substrate is layered, the semiconductor sublayer comprising logic circuitry configured to control at least the solid state data storage array.

13. The solid state data storage array of claim 10, comprising:
the gate portions of the wordlines individually selectable by control circuitry to measure associated resistance properties of at least a subset of the ReRAM elements in series with selected gate portions through an end of an associated wordline.

14. The solid state data storage array of claim 13, comprising:
ends of the wordlines each communicatively coupled to the control circuitry configured to measure at least series resistance properties across ReRAM elements comprising each of the wordlines.

* * * * *